United States Patent
Chang

(10) Patent No.: US 11,521,893 B2
(45) Date of Patent: Dec. 6, 2022

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventor: Jen-Yuan Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/085,327

(22) Filed: Oct. 30, 2020

(65) Prior Publication Data

US 2022/0139771 A1 May 5, 2022

(51) Int. Cl.
| | |
|---|---|
| H01L 27/11556 | (2017.01) |
| H01L 21/768 | (2006.01) |
| H01L 21/306 | (2006.01) |
| H01L 21/56 | (2006.01) |
| H01L 23/00 | (2006.01) |

(52) U.S. Cl.
CPC .. *H01L 21/76802* (2013.01); *H01L 21/30604* (2013.01); *H01L 21/565* (2013.01); *H01L 21/76898* (2013.01); *H01L 24/05* (2013.01); *H01L 24/32* (2013.01); *H01L 2224/05026* (2013.01); *H01L 2224/32151* (2013.01); *H01L 2924/351* (2013.01)

(58) Field of Classification Search
CPC ......... H01L 21/76802; H01L 21/30604; H01L 21/565; H01L 21/76898; H01L 24/05; H01L 24/32; H01L 2224/05026; H01L 2224/32151; H01L 2924/351

See application file for complete search history.

(56) References Cited

U.S. PATENT DOCUMENTS

| | | | |
|---|---|---|---|
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 10,381,322 B1 * | 8/2019 | Azuma | H01L 24/80 |
| 2016/0197055 A1 * | 7/2016 | Yu | H01L 25/50 257/737 |
| 2017/0092626 A1 * | 3/2017 | Yuan | H01L 21/76898 |

\* cited by examiner

*Primary Examiner* — Thanh T Nguyen
(74) *Attorney, Agent, or Firm* — WPAT; Anthony King

(57) ABSTRACT

A semiconductor structure includes a first die, a second die over the first die, and a positioning member disposed within a bonding dielectric and configured to align the second die with the first die. A method for forming a semiconductor structure includes receiving a first die having a first bonding layer; forming a recess on the first bonding layer; forming a positioning member on a second die; bonding the second die over the first die using the first bonding layer; and disposing the positioning member into the recess.

20 Claims, 13 Drawing Sheets

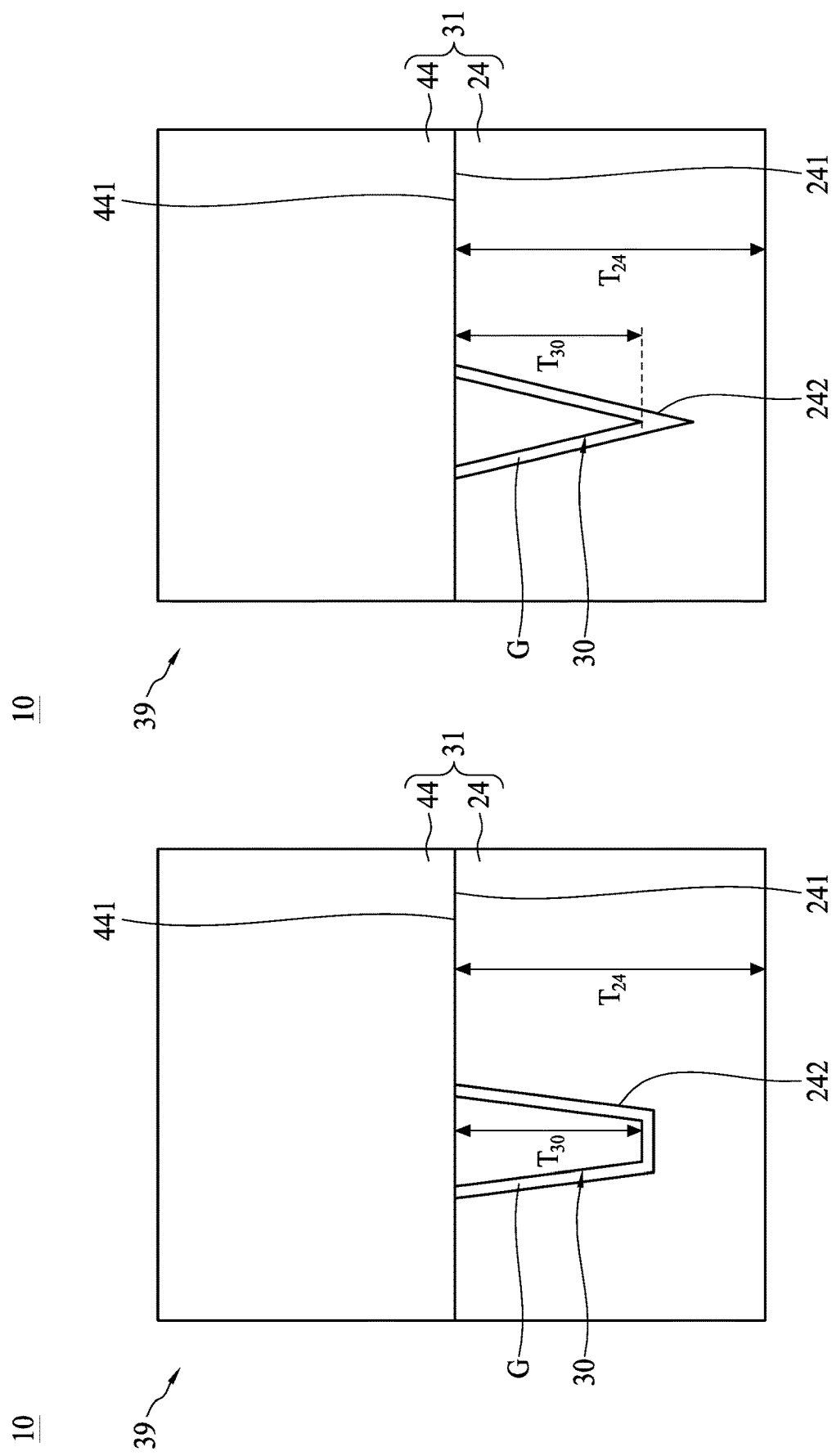

SEMICONDUCTOR STRUCTURE AND METHOD FOR FORMING THE SAME

BACKGROUND

The semiconductor industry has experienced rapid growth due to ongoing improvements in the integration density of a variety of components (e.g., photoelectric devices and electrical components, etc.). To accommodate the miniaturized scale of the semiconductor device, various technologies and applications have been developed for the wafer-level packaging, involving greater numbers of different components with different functions. Improvement in integration density has resulted from iterative reduction of minimum feature size, which allows more components to be integrated into a given area.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A and 3B are enlarged cross-sectional views of a portion of a semiconductor structure in accordance with some embodiments of the present disclosure.

DETAILED DESCRIPTION

Figure 1:
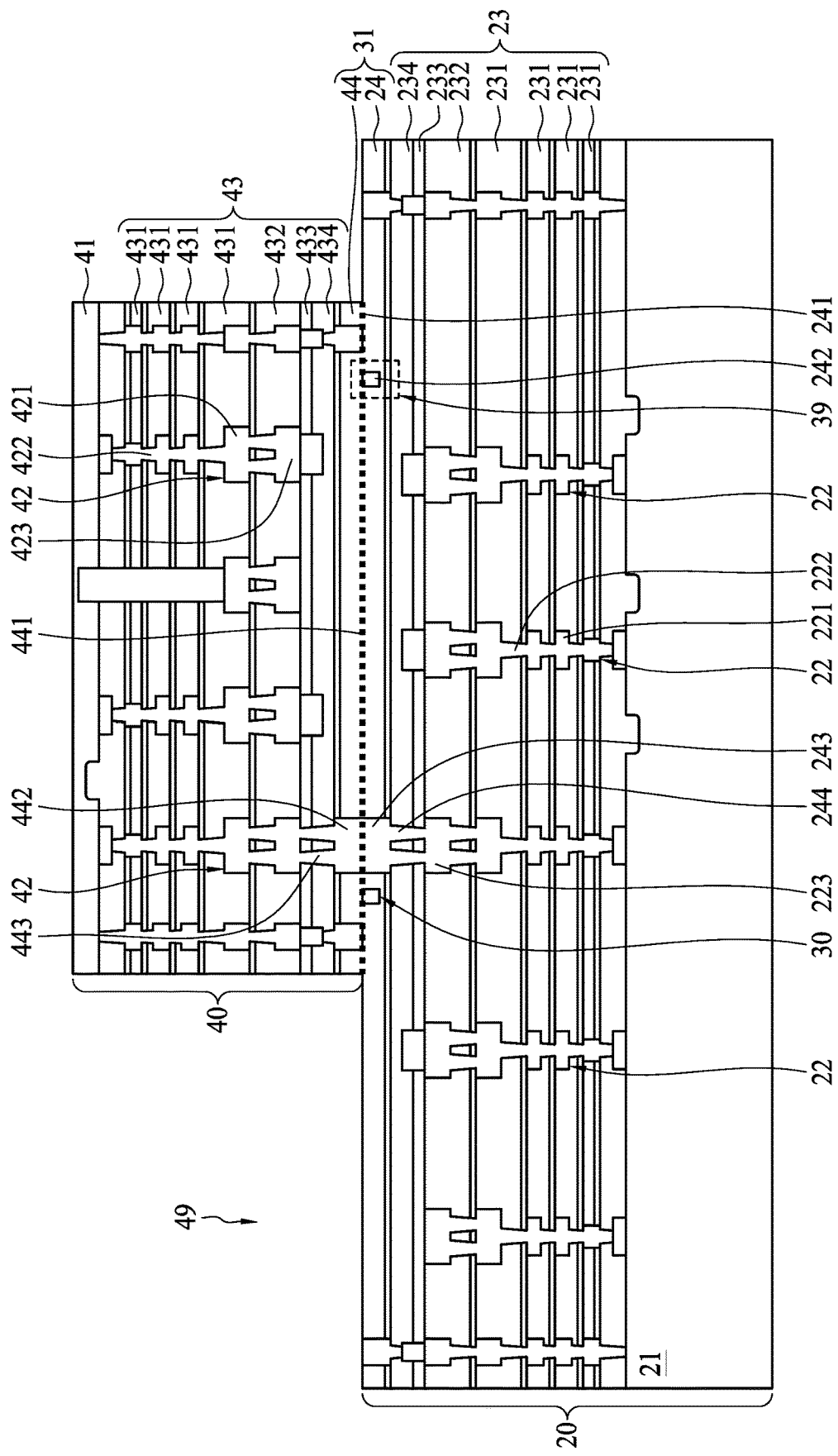
FIG. 1 is a cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In the present disclosure, a semiconductor structure and a method for forming a semiconductor structure are provided. In particular, a semiconductor structure including a first die, a second die, a bonding dielectric, and a positioning member is disclosed below. A method for forming a semiconductor structure including the positioning member is also disclosed below. Other features and processes may also be included. The semiconductor structure includes the positioning member configured to align the second die with the first die.

Figure 2:
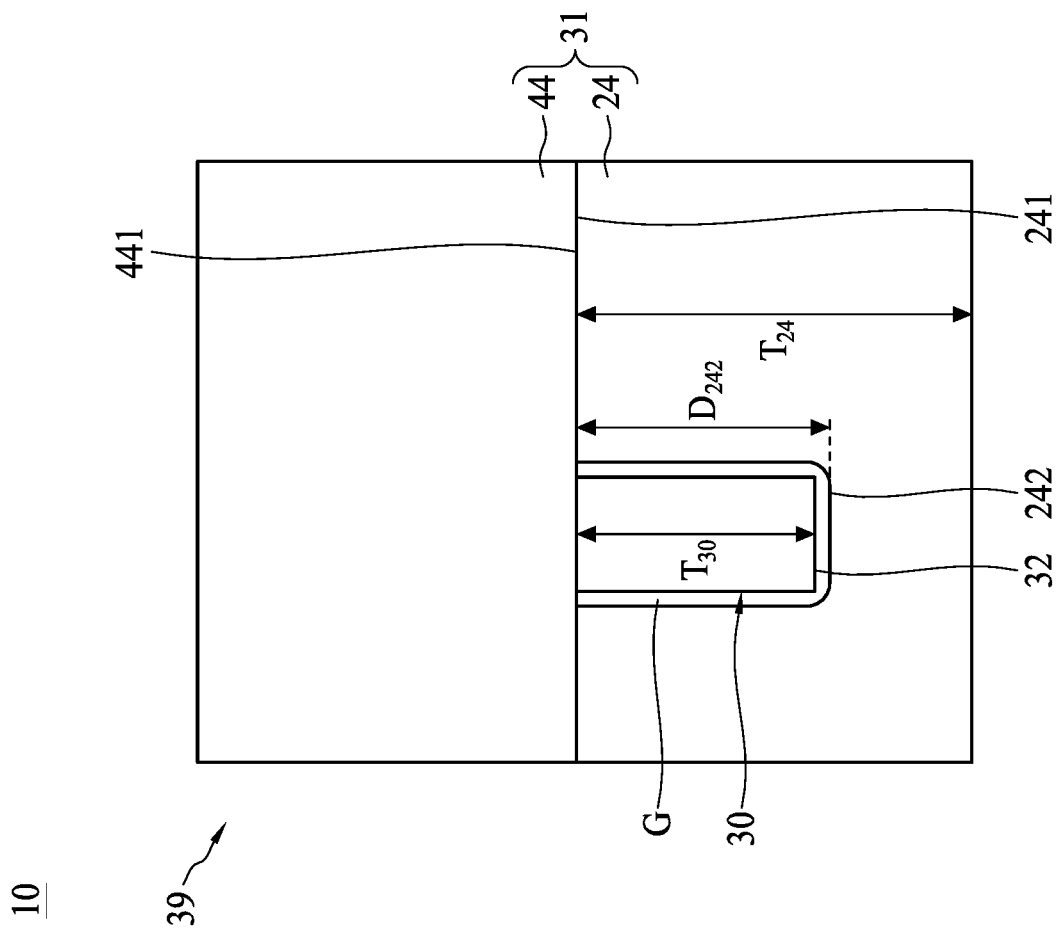
FIG. 2 is an enlarged cross-sectional view of a portion of a semiconductor structure in accordance with some embodiments of the present disclosure.

FIG. 1 is a cross-sectional view of a semiconductor structure 10 in accordance with some embodiments of the present disclosure. FIG. 2 is an enlarged cross-sectional view of a portion 39 of the semiconductor structure 10 in accordance with some embodiments of the present disclosure.

Referring to FIGS. 1 and 2, the semiconductor structure 10 includes a first die 20, a second die 40 over the first die 20, a bonding dielectric 31 disposed between the first die 20 and the second die 40, and a positioning member 30 disposed within the bonding dielectric 31. FIG. 1 illustrates the bonding of the first die 20 to the second die 40. In some embodiments, the positioning member 30 is configured to align the second die 40 with the first die 20.

In some embodiments, the first die 20 is a logic die, which may be a central processing unit (CPU) die, a micro control unit (MCU) die, an input-output (IO) die, a baseband (BB) die, an application processor (AP) die, or the like. In some embodiments, the first die 20 is a memory die such as a dynamic random-access memory (DRAM) die or a static random-access memory (SRAM) die, or may be another type of die. The first die 20 may include active devices (not shown) such as transistors and/or diodes, and may include passive devices (not shown) such as capacitors, inductors, resistors, or the like.

In some embodiments, the first die 20 includes a first semiconductor substrate 21 and a first interconnect structure 22 formed over a top surface of the first semiconductor substrate 21. In some embodiments, the first semiconductor substrate 21 is a semiconductor substrate, such as a bulk semiconductor, a semiconductor-on-insulator (SOI) substrate, or the like, and may be doped (e.g., with a p-type or n-type dopant) or undoped. The first semiconductor substrate 21 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the first semiconductor substrate 21 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or a combination thereof. In an embodiment, the first semiconductor substrate 21 is a silicon wafer.

In some embodiments, a dielectric layer 23 is disposed on the first semiconductor substrate 21 and surrounds the first interconnect structure 22. In some embodiments, the dielectric layer 23 is an inter-metal dielectric (IMD).

In some embodiments, the dielectric layer 23 includes low-k dielectric material. The dielectric constant (k value) of the low-k dielectric material may be lower than 3.0, or lower than about 2.5, and the dielectric material is therefore also referred to as an extreme low-k (ELK) dielectric material. In some embodiments, the dielectric layer 23 includes a polymer, such as, for example, polyimide, polyBenzOxazole (PBO), benzocyclobutene (BCB), ajinomoto buildup film (ABF), solder resist film (SR), or the like. In some embodiments, the dielectric layer 23 includes a plurality of dielectric sub-layers 231, 232 disposed over the first semiconductor substrate 21. In some embodiments, the dielectric sub-layer 231 is disposed on the first semiconductor substrate 21, and the dielectric sub-layer 232 is disposed on the dielectric sub-layer 231. A person having ordinary skill in the art would understand that the number of the dielectric sub-layers shown in FIG. 1 merely serves as an exemplary illustration, and different numbers of the dielectric sub-layers 231, 232 can be included. In some embodiments, the materials included in the dielectric sub-layers 231, 232 are the same material or different materials.

In some embodiments, the semiconductor structure 10 includes a plurality of first interconnect structures 22. In some embodiments, each of the first interconnect structures 22 includes a plurality of metal layers 221 and a plurality of connecting vias 222. The metal layers 221 are formed in a stacked configuration, and the connecting vias 222 connect the metal layers 221. In some embodiments, the metal layers 221 and the connecting vias 222 can be referred to as a dual damascene structure.

In some embodiments, each of the first interconnect structures 22 further includes a top metal layer 223 surrounded by the dielectric sub-layer 232. The top metal layer 223 electrically connects to the corresponding metal layers 221 and the connecting vias 222.

In some embodiments, the dielectric layer 23 further includes dielectric sub-layers 233, 234 disposed over the top metal layer 223 and the dielectric sub-layer 232. In some embodiments, the dielectric sub-layer 233 is disposed on the dielectric sub-layer 232, and the dielectric sub-layer 234 is disposed on the dielectric sub-layer 233. The dielectric sub-layer 233 may be formed of silicon oxide, silicon oxynitride, silicon oxy-carbide, or the like, and the dielectric sub-layer 234 may be formed of a dielectric material different from the dielectric material of the dielectric sub-layer 233. For example, the dielectric sub-layer 234 may be formed of silicon nitride, silicon carbide, or the like.

In some embodiments, a first bonding layer 24 is disposed on the dielectric layer 23 of the first die 20. The first bonding layer 24 is disposed between the first die 20 and the second die 40. The first bonding layer 24 has a first surface 241 facing the second die 40. The first bonding layer 24 includes dielectric material. The first bonding layer 24 may be formed of silicon oxide, silicon oxynitride, silicon oxy-carbide, or the like. The first bonding layer 24 may be formed of a dielectric material similar to the dielectric material of the dielectric layer 23. In some embodiments, the first bonding layer 24 is a single layer or multiple layers stacked over each other.

In some embodiments, a metal pad 243 is disposed on the dielectric layer 23 of the first die 20. The metal pad 243 is surrounded by the first bonding layer 24 and is electrically connected to the first interconnect structure 22. In some embodiments, at least a portion of the metal pad 243 is exposed through the first bonding layer 24. In some embodiments, the metal pad 243 is electrically connected to the first interconnect structure 22 through a via 244. The vias 244 and the metal pads 243 may be formed using a dual damascene process, which includes forming via openings in the dielectric sub-layers 234 and 233, forming trenches in the first bonding layer 24, and filling the via openings and the trenches with conductive materials. A planarization process such as a CMP process or a mechanical grinding process is performed to level top surfaces of the first bonding layer 24 and the metal pad 243. The filling of the openings and the trenches with the conductive materials may include depositing a diffusion barrier such as a titanium nitride layer, a tantalum nitride layer, a titanium layer, a tantalum layer, or the like, and depositing a copper-containing material over the diffusion barrier.

In some embodiments, the first die 20 is electrically coupled to the second die 40. In some embodiments, the metal pad 243 of the first die 20 is electrically coupled to the second die 40.

In some embodiments, the second die 40 is a logic die, which may be a CPU die, an MCU die, an TO die, a BB die, an AP die, or the like. In some embodiments, the second die 40 is a memory die such as a DRAM die or an SRAM die. In other embodiments, the second die 40 may be another type of die. The second die 40 may include active devices (not shown) such as transistors and/or diodes, and may include passive devices (not shown) such as capacitors, inductors, resistors, or the like. Although one second die 40 is illustrated, there may be a plurality of second dies 40 bonded to the first die 20, and spaces 49 are disposed between adjacent pairs of the second dies 40.

In some embodiments, the second die 40 includes a second semiconductor substrate 41 and a second interconnect structure 42 formed at a surface of the second semiconductor substrate 41. A thickness of the second semiconductor substrate 41 may be equal to or less than a thickness of the first semiconductor substrate 21. In some embodiments, a dielectric layer 43 is attached to the second semiconductor substrate 41 and surrounding the second interconnect structure 42. In some embodiments, the dielectric layer 43 is an inter-metal dielectric (MID).

In some embodiments, the dielectric layer 43 includes a plurality of dielectric sub-layers 431, 432 attached to the second semiconductor substrate 41. In some embodiments, the dielectric sub-layer 431 attaches to the second semiconductor substrate 41, and the dielectric sub-layer 432 attaches to the dielectric sub-layer 431.

In some embodiments, the semiconductor structure 10 includes a plurality of second interconnect structures 42. In some embodiments, each of the second interconnect structures 42 includes a plurality of metal layers 421 and a plurality of connecting vias 422.

In some embodiments, each of the second interconnect structures 42 further includes a top metal layer 423 surrounded by the dielectric sub-layer 432. The top metal layer 423 electrically connects to the corresponding metal layers 421 and the connecting vias 422.

In some embodiments, the dielectric layer 43 further includes dielectric sub-layers 433, 434 attached to the top metal layer 423 and the dielectric sub-layer 432. In some embodiments, the dielectric sub-layer 433 attaches to the dielectric sub-layer 432, and the dielectric sub-layer 434 attaches to the dielectric sub-layer 433.

The configurations and materials of the second semiconductor substrate 41, the second interconnect structure 42 and the dielectric layer 43 of the second die 40 may be similar to their corresponding parts in the first die 20, and detailed descriptions are not repeated herein.

In some embodiments, a second bonding layer 44 attaches to the dielectric layer 43 of the second die 40. The second bonding layer 44 is disposed between the first die 20 and the second die 40. The second bonding layer 44 has a second surface 441 facing the second die 40.

The second bonding layer 44 includes dielectric material. The second bonding layer 44 may be formed of silicon oxide, silicon oxynitride, silicon oxy-carbide, or the like. The second bonding layer 44 may be formed of a dielectric material similar to the dielectric material of the dielectric layer 43. The second bonding layer 44 may be formed of a dielectric material similar to or different from the dielectric material of the first bonding layer 24.

In some embodiments, a metal pad 442 attaches to the dielectric layer 43 of the second die 40. The metal pad 442 is surrounded by the second bonding layer 44 and is electrically connected to the second interconnect structure 42. In some embodiments, at least a portion of the metal pad 442 is exposed through the second bonding layer 44. In some embodiments, the metal pad 442 is electrically connected to the second interconnect structure 42 through a via 443. The vias 443 and the metal pads 442 may be formed using a dual damascene process.

In some embodiments, the metal pad 243 of the first bonding layer 24 is in contact with the metal pad 442 of the second bonding layer 44. In some embodiments, the metal pad 243 is bonded to the metal pad 442 through metal-to-metal direct bonding. The size of the metal pad 442 may be different from or substantially equal to the size of the respective metal pad 243.

In some embodiments, the second bonding layer 44 is in contact with the first bonding layer 24. In some embodiments, the second surface 441 is in contact with the first surface 241. In some embodiments, the second bonding layer 44 is bonded to the first bonding layer 24 through dielectric-to-dielectric bonding, such as fusion bonding.

In some embodiments, the bonding dielectric 31 is disposed between the first die 20 and the second die 40. In some embodiments, the bonding dielectric 31 includes the first bonding layer 24 and the second bonding layer 44. The positioning member 30 is disposed within the bonding dielectric 31.

In some embodiments, the positioning member 30 protrudes from the second surface 441 of the second bonding layer 44. In some embodiments, the positioning member 30 protrudes from the second bonding layer 44 and is received by the first bonding layer 24. The first bonding layer 24 may surround the positioning member 30. In some embodiments, the positioning member 30 and the second bonding layer 44 are integrally formed. In some embodiments, the positioning member 30 is formed on the second bonding layer 44 or at the second surface 441 of the second bonding layer 44. In some embodiments, a recess 242 in the first bonding layer 24 extends from the first surface 241 of the first bonding layer 24 towards the first die 20, and the positioning member 30 is disposed in the recess 242. In some embodiments, the positioning member 30 protrudes from the first bonding layer 24 and is received by the second bonding layer 44. The positioning member 30 is isolated from the first interconnect structure 22 and the second interconnect structure 42. In some embodiments, the positioning member 30 and the metal pad 243 are laterally offset from a top view. Similarly, the positioning member 30 and the metal pad 442 are laterally offset from a top view.

In some embodiments, the positioning member 30 includes metal, dielectric or a combination thereof. In some embodiments, the positioning member 30 includes Al, $Si_2O_3$ or TiN. However, the disclosure is not limited thereto. In some alternative embodiments, other suitable materials are adapted for the positioning member 30. In some embodiments, a material of the positioning member 30 is similar to the dielectric material of the second bonding layer 44. In some embodiments, materials of the positioning member 30, the first bonding layer 24 and the second bonding layer 44 are similar. In some embodiments, the materials of the positioning member 30, the first bonding layer 24 and the second bonding layer 44 are different from each other.

In some embodiments, as shown in FIG. 2, a thickness T30 of the positioning member 30 is defined as a distance between the second surface 441 and a top surface 32 of the positioning member 30. In some embodiments, a thickness T24 of the first bonding layer 24 is greater than the thickness T30 of the positioning member 30. In some embodiments, the thickness T24 of the first bonding layer 24 is equal to the thickness T30 of the positioning member 30.

The positioning member 30 is configured to align the second die 40 with the first die 20. The first surface 241 and the second surface 441 are bonded with each other. Therefore, the dimension of the positioning member 30 corresponds to the dimension of the recess 242. In some embodiments, the positioning member 30 is conformal to the corresponding recess 242.

In some embodiments, considering the process of die bonding, the physical properties of the positioning member 30 and the bonding dielectric 31, such as thermal expansion coefficient and hardness, will affect bonding of the first and second dies 20, 40.

In some embodiments, a gap G is disposed between the positioning member 30 and the bonding dielectric 31. The gap G is configured to allow buffer for thermal expansion or contraction of the positioning member 30 and the bonding dielectric 31. In some embodiments, the gap G is disposed between the positioning member 30 and the first bonding layer 24. In some embodiments, the recess 242 has a depth D242. In some embodiments, the depth D242 of the recess 242 is greater than or equal to the thickness T30 of the positioning member 30. In some embodiments, the gap G between the positioning member 30 and the recess 242 is minimized or even absent.

In some embodiments, a coefficient of thermal expansion (CTE) of the bonding dielectric 31 corresponds to a CTE of the positioning member 30 in order to achieve a wider process window of die bonding. In some embodiments, the CTE of the bonding dielectric 31 and the CTE of the positioning member 30 are substantially same or different. In some embodiments, the CTE of the positioning member 30 is substantially different from the CTE of the first bonding layer 24. In some embodiments, the CTE of the positioning member 30 is substantially equal to the CTE of the first bonding layer 24. In some embodiments, the CTE of the positioning member 30 is substantially equal to the CTE of the second bonding layer 44.

FIGS. 3A and 3B are enlarged cross-sectional views of a portion 39 of the semiconductor structure 10 in accordance with some embodiments of the present disclosure. The shape of the positioning member 30 is not particularly limited, and may be columnar as shown in FIGS. 1 and 2, or tapered toward the first die 20 as shown in FIGS. 3A and 3B. The column may be a square column, a rectangular column, a circular column, a triangular column, a trapezoidal column, or a T-shaped column. In some embodiments, the shape of the positioning member 30 is a trapezoid or triangle from a cross-sectional view as shown in FIGS. 3A and 3B, respectively.

Figure 4A:
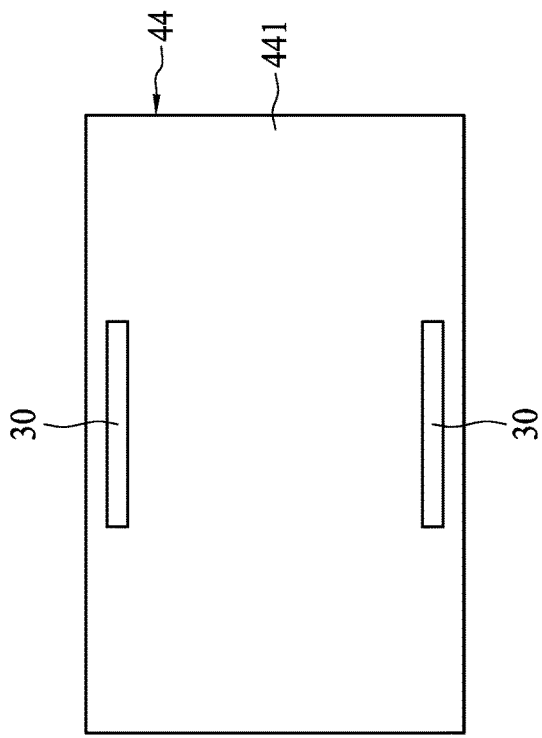
FIGS. 4A to 4D are top views of a portion of a semiconductor structure in accordance with some embodiments of the present disclosure.
Figure 4B:
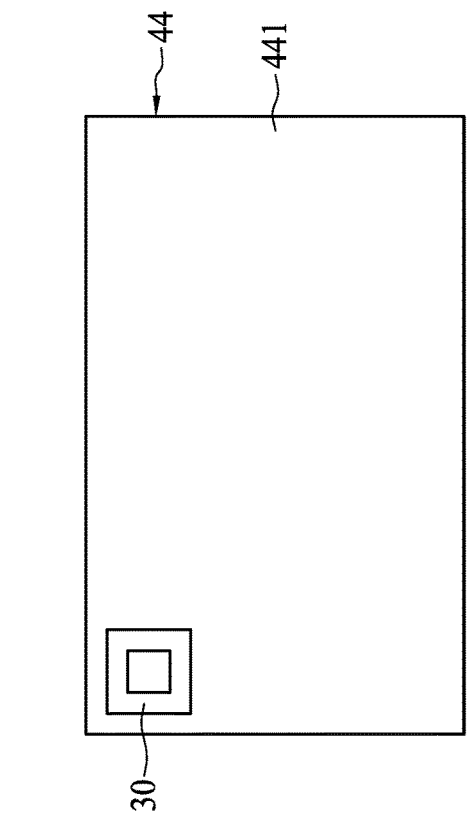
Figure 4C:
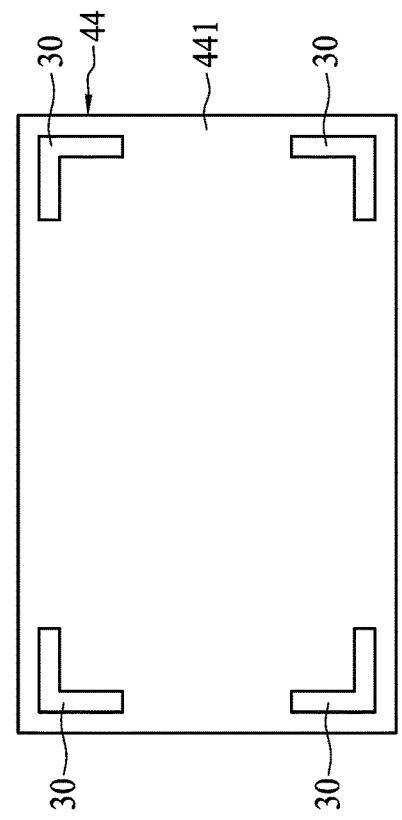
Figure 4D:
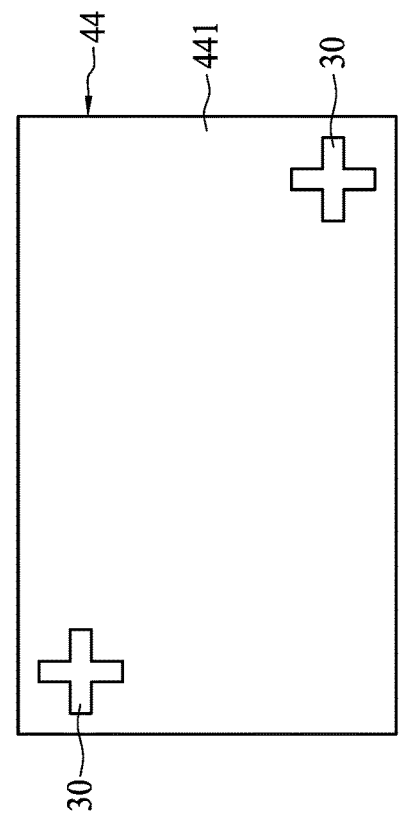

FIGS. 4A to 4D are top views of a second die 40 of the semiconductor structure 10 in accordance with some embodiments of the present disclosure. In some embodiments, the shape of the positioning member 30 may be as shown in FIGS. 4A to 4D. In some embodiments, the positioning member 30 is disposed on the periphery of the second surface 441 of the second bonding layer 44. The shape of the positioning member 30 may be a hollow column as shown in FIG. 4A. In some embodiments, the shape of the positioning member 30 is a cross shape or an L-shape from a top view as shown in FIGS. 4C and 4D, respectively. Additionally, the positioning members 30 in each of FIGS. 4B to 4D have similar features; this is intended to be illustrative and is not intended to limit the embodiments, as, in various embodiments, the positioning members 30 have similar structures or different structures in order to achieve desired functional capabilities.

Further, the number and position of the positioning member 30 are not particularly limited, and may be adjusted according to actual needs. In some embodiments, the semiconductor structure 10 includes one positioning member 30 disposed on the second surface 441 of the second bonding layer 44 as shown in FIG. 4A. In some embodiments, the semiconductor structure 10 includes two positioning members 30 disposed on two opposite corners or two opposite sides of the second surface 441 of the second bonding layer 44 as shown in FIGS. 4B and 4C. In some embodiments, the semiconductor structure 10 includes a plurality of positioning members 30 disposed on every corner of the second surface 441 of the second bonding layer 44 as shown in FIG. 4D. In some embodiments, the semiconductor structure 10 includes four positioning members 30.

Figure 5:
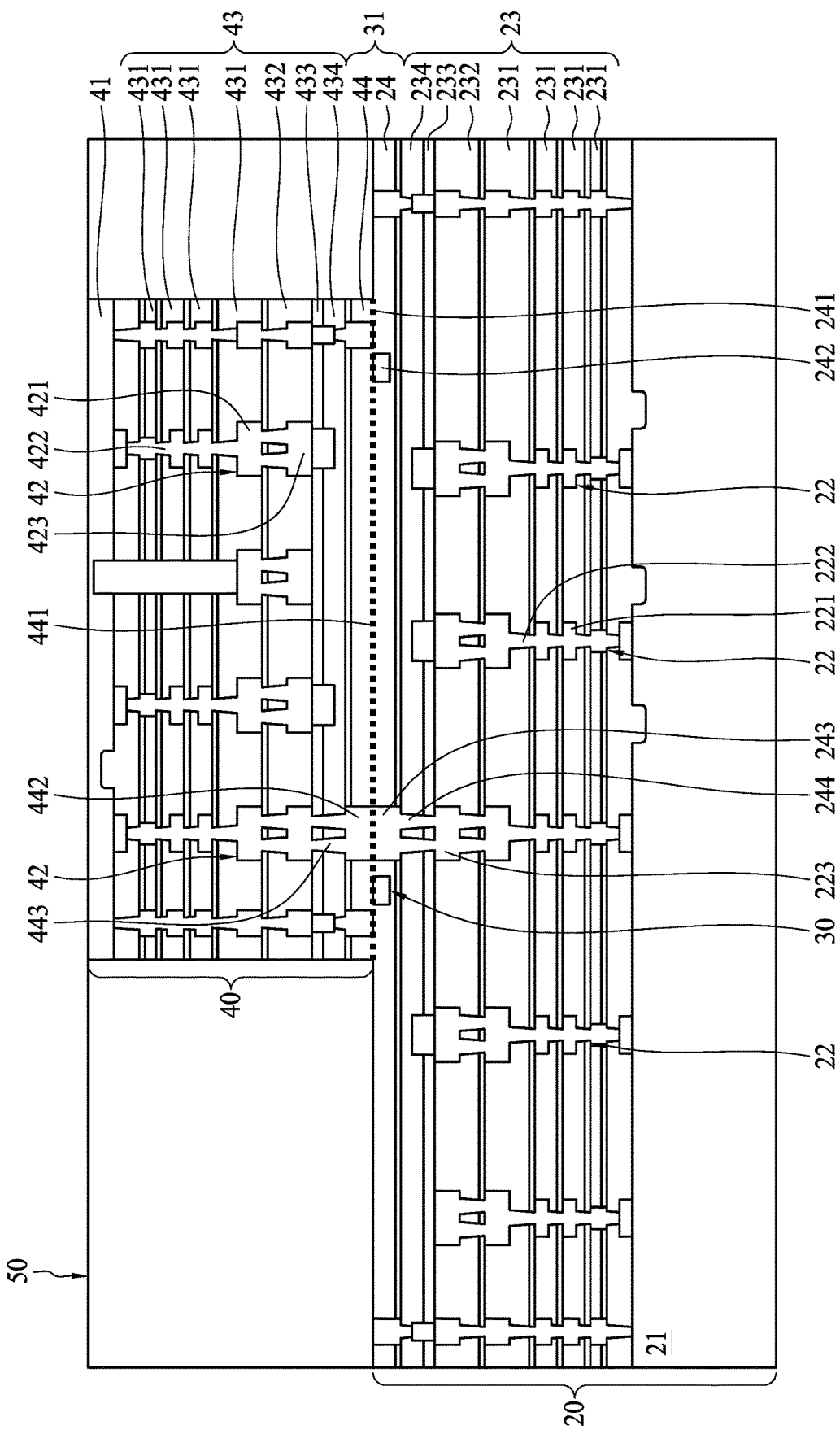
FIG. 5 is a cross-sectional view of a semiconductor structure in accordance with some embodiments of the present disclosure.

FIG. 5 is a cross-sectional view of a semiconductor structure 10 in accordance with some embodiments of the present disclosure. In some embodiments, the semiconductor structure 10 further includes a molding 50 surrounding the second die 40. In some embodiments, a portion of the first bonding layer 24 is exposed through the second bonding layer 44 and is in contact with the molding 50. In some embodiments, the molding 50 fills spaces 49 between adjacent pairs of second dies 40. In some embodiments, a thickness of the molding 50 is substantially equal to the thickness of the second die 40.

Figure 6:
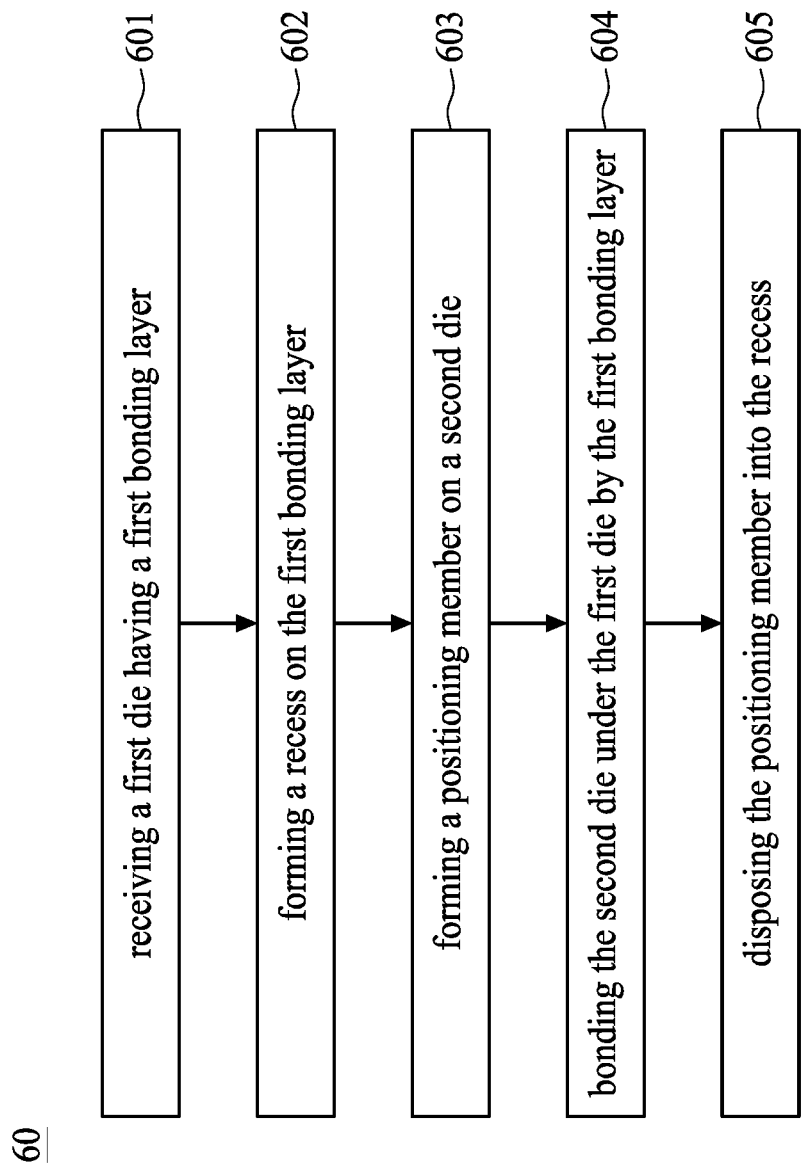
FIGS. 6 and 7 are flowcharts of a method for forming a semiconductor structure in accordance with some embodiments of the present disclosure.

FIG. 6 is a flowchart of a method 60 for forming a semiconductor structure in accordance with some embodiments of the present disclosure. As illustrated in FIG. 6, the method 60 includes several operations: (601) receiving a first die having a first bonding layer; (602) forming a recess on the first bonding layer; and (603) forming a positioning member on a second die. The method 60 further includes (604) bonding the second die over the first die using the first bonding layer; and (605) disposing the positioning member into the recess.

Figure 7:
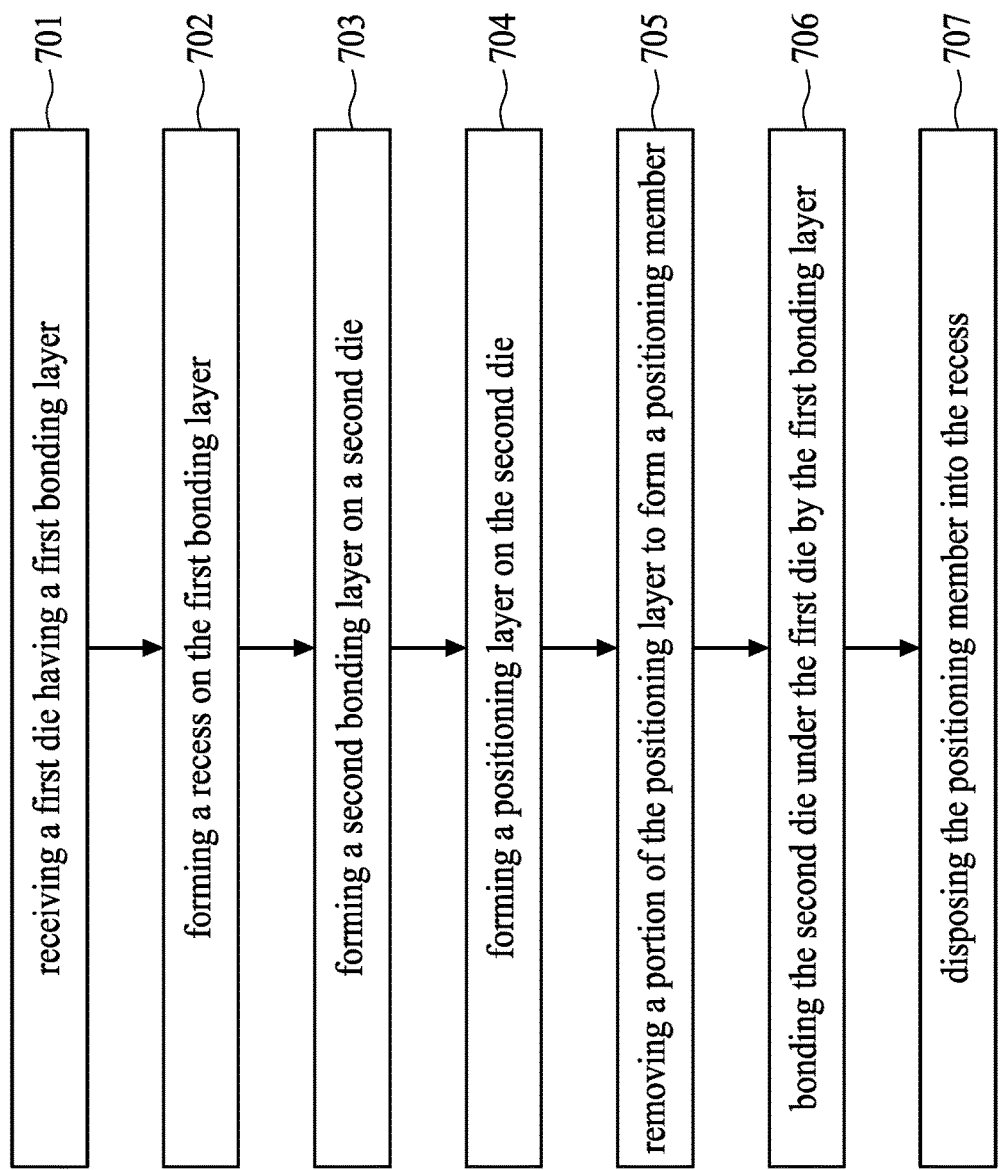

FIG. 7 is a flowchart of a method 70 for forming a semiconductor structure in accordance with some embodiments of the present disclosure. As illustrated in FIG. 7, the method 70 includes several operations: (701) receiving a first die having a first bonding layer; (702) forming a recess on the first bonding layer; (703) forming a second bonding layer on a second die; and (704) forming a positioning layer on the second die. The method 70 further includes (705) removing a portion of the positioning layer to form a positioning member; (706) bonding the second die over the first die using the first bonding layer; and (707) disposing the positioning member into the recess.

FIGS. 8 to 13 are schematic cross-sectional views of a semiconductor structure formed using the method 70 in accordance with some embodiments of the present disclosure. In some embodiments, the method 70 is configured to form the semiconductor structure 10 as illustrated in FIGS. 1 and 2.

Figure 8:
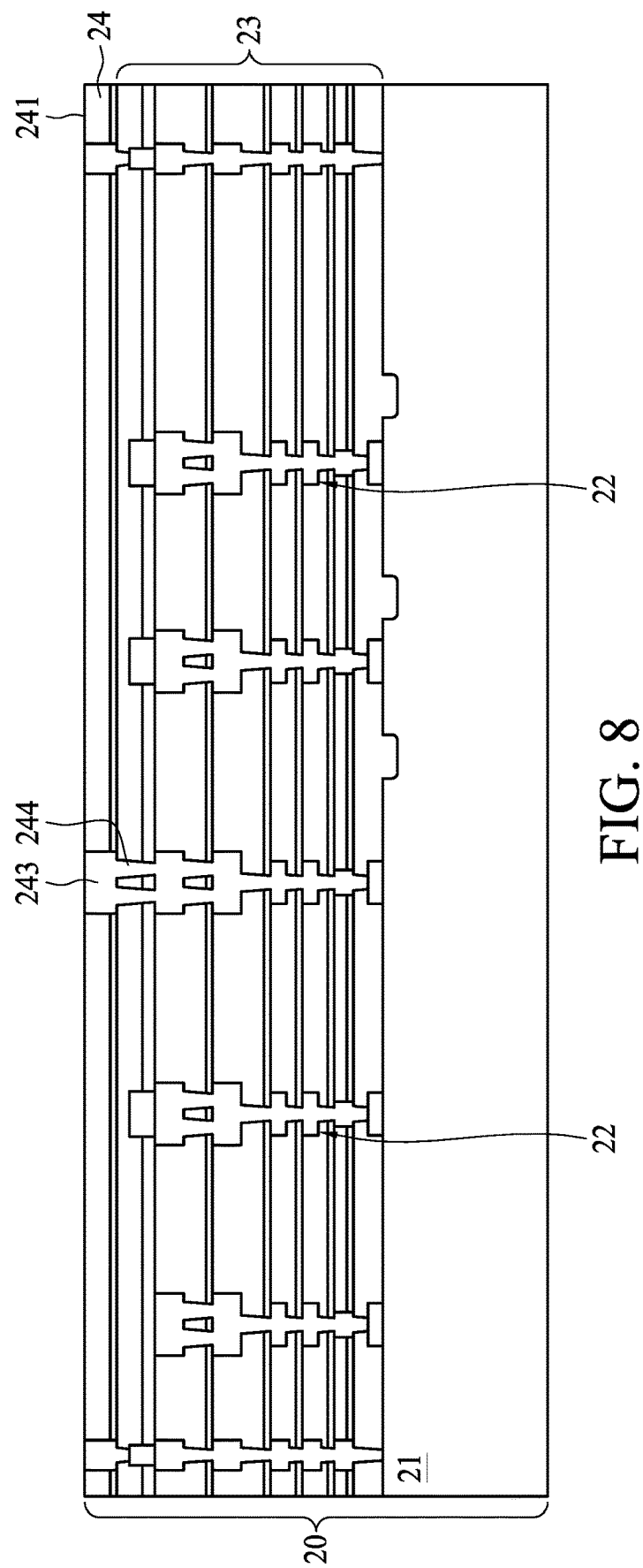
FIGS. 8 to 13 are cross-sectional views of one or more stages of the method for forming a semiconductor structure in accordance with some embodiments of the present disclosure.

As illustrated in FIG. 8, in operation 701, a first die 20 having a first bonding layer 24 is received. In some embodiments, the first die 20 includes a metal pad 243 surrounded by the first bonding layer 24 and electrically connected to a first interconnect structure 22.

Figure 9:
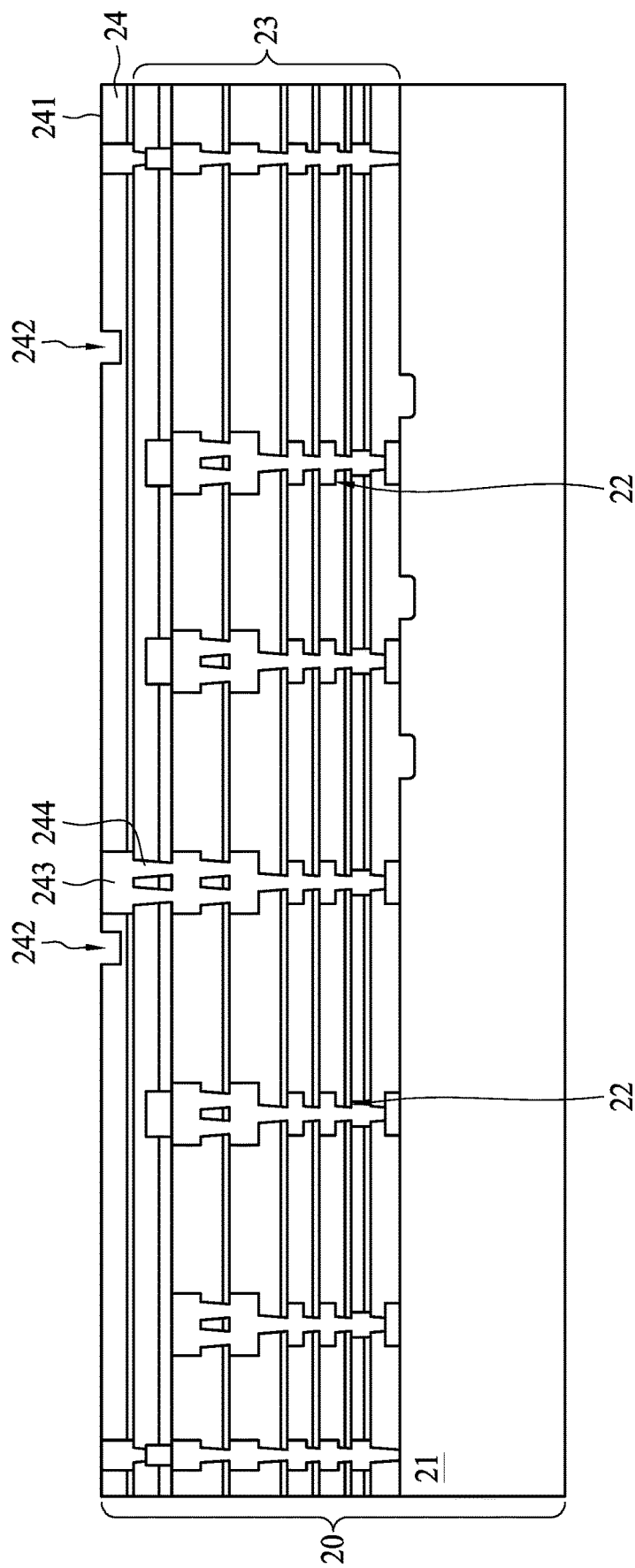

As illustrated in FIG. 9, in operation 702, a recess 242 is formed on the first bonding layer 24. In some embodiments, a portion of the first bonding layer 24 is removed to form the recess 242. The portion of the first bonding layer 24 may be removed by a stripping process and/or an etching process. In some embodiments, a plurality of the recesses 242 are formed on a first surface 241 of the first bonding layer 24. In some embodiments, the recesses 242 are separated from each other. In some embodiments, the recess 242 is formed to have a depth similar to or less than a thickness of the first bonding layer 24. In some embodiments, the recess 242 exposes a dielectric layer 23 of the first die 20. In some embodiments, the recess 242 and the first interconnect structure 22 are offset from a top view.

Figure 10:
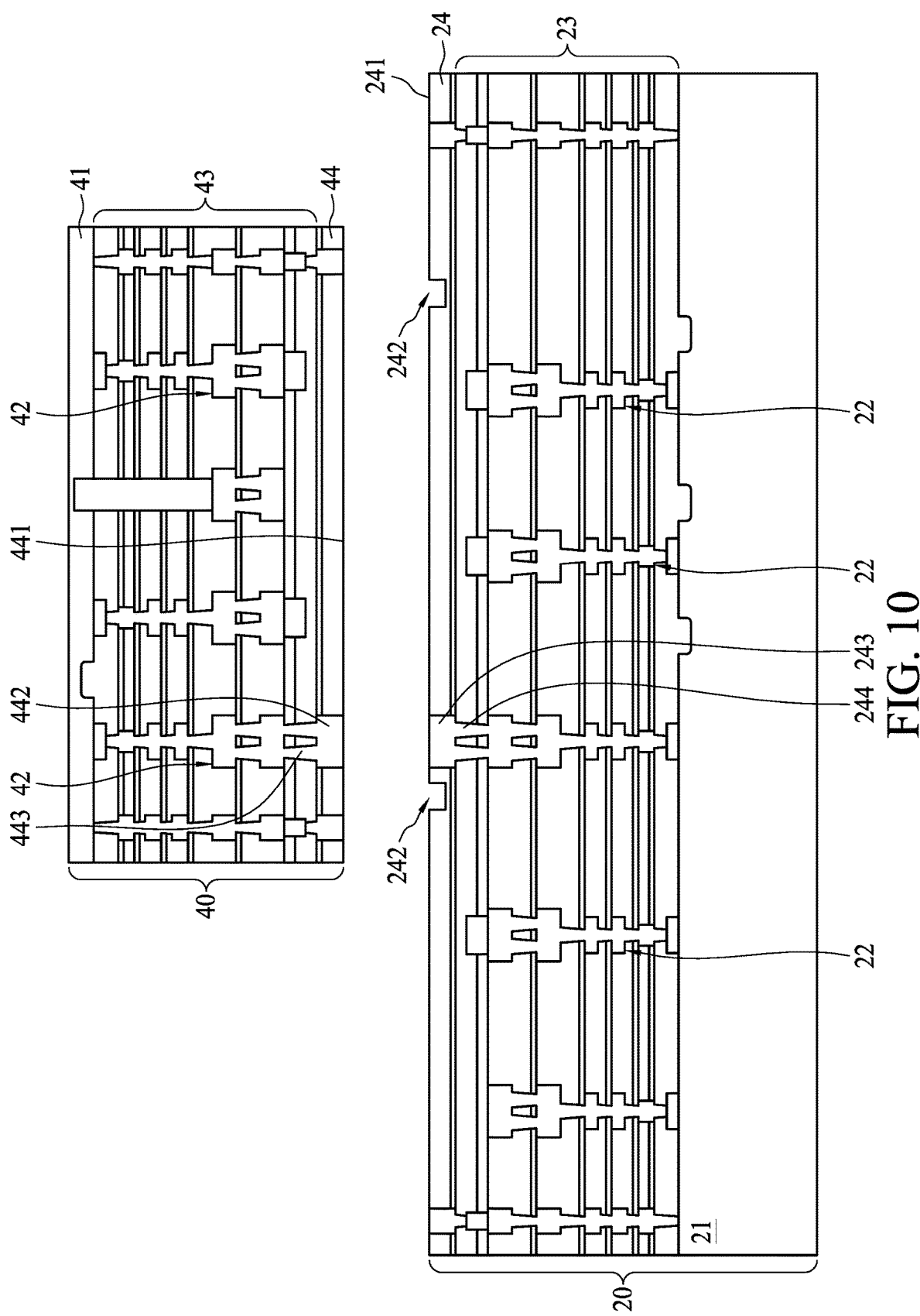

As illustrated in FIG. 10, in operation 703, a second bonding layer 44 is formed on a second die 40. In some embodiments, the second bonding layer 44 includes dielectric material. In some embodiments, the second bonding layer 44 is formed by suitable fabrication techniques such as spin coating, chemical vapor deposition (CVD), plasma-enhanced chemical vapor deposition (PECVD), or the like. In some embodiments, the second bonding layer 44 is a single layer or multiple layers stacked over each other.

In some embodiments, a metal pad 442 electrically connected to a second interconnect structure 42 of the second die 40 and surrounded by the second bonding layer 44 is formed. In some embodiments, at least a portion of the metal pad 442 is exposed through the second bonding layer 44.

Figure 11:
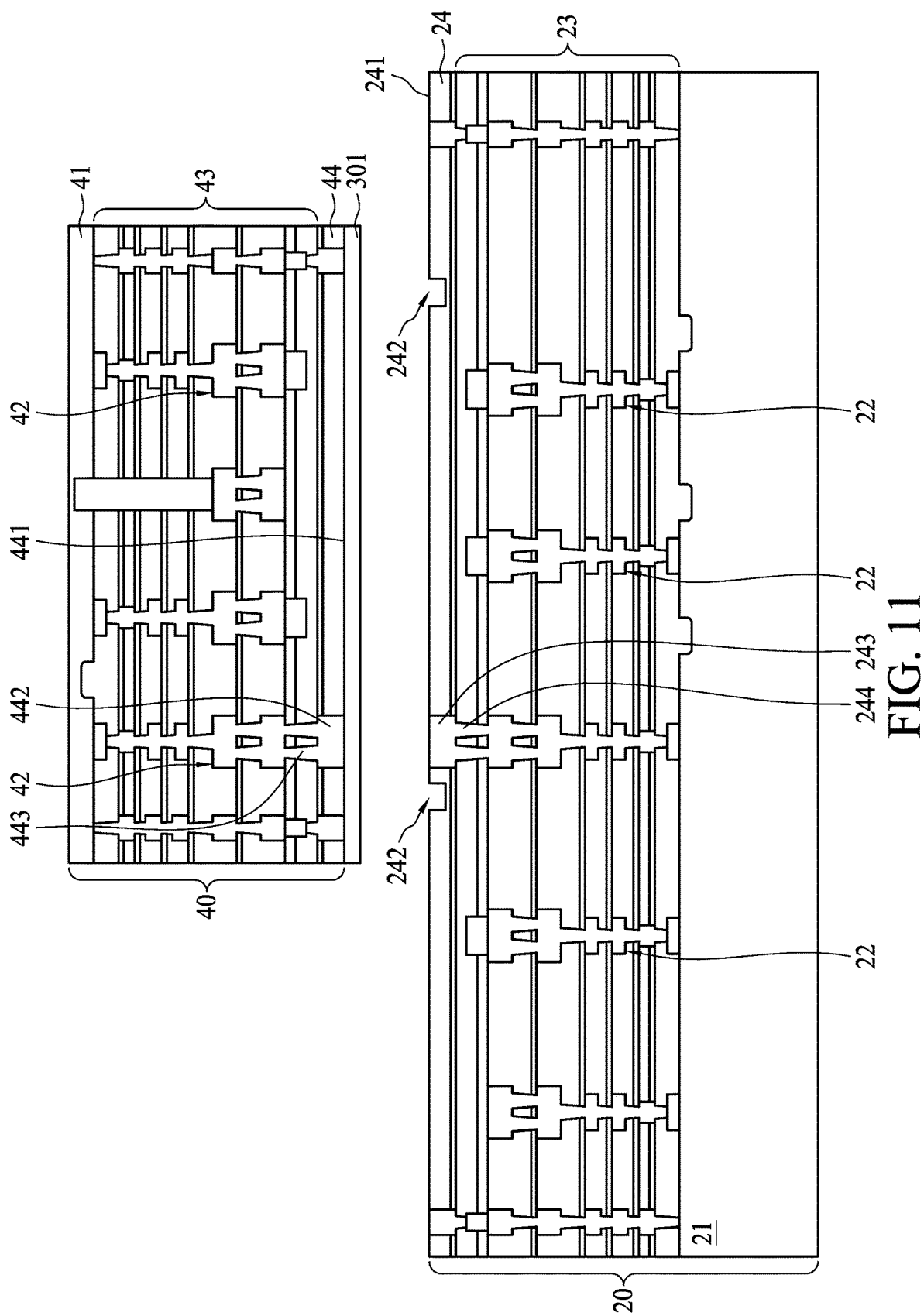

As illustrated in FIG. 11, in operation 704, a positioning layer 301 is formed on the second die 40. In some embodiments, the positioning layer 301 is disposed on the metal pad 442 and the second bonding layer 44.

In some embodiments, the positioning layer 301 includes a dielectric material. In some embodiments, a dielectric paste included the dielectric material is applied over the metal pad 442 and the second bonding layer 44. In some embodiments, the dielectric paste is in a liquid state at room temperature. In some embodiments, the dielectric paste is a slurry paste. In some embodiments, the dielectric paste includes a solvent to enhance the coating fluidity.

In some embodiments, the positioning layer 301 includes metallic material, and the positioning layer 301 is deposited over the metal pad 442 and the second bonding layer 44 by plating, such as electroplating or electro-less plating. In some embodiments, the dielectric material of the positioning layer 301 is similar to the dielectric material of the second bonding layer 44.

Figure 12:
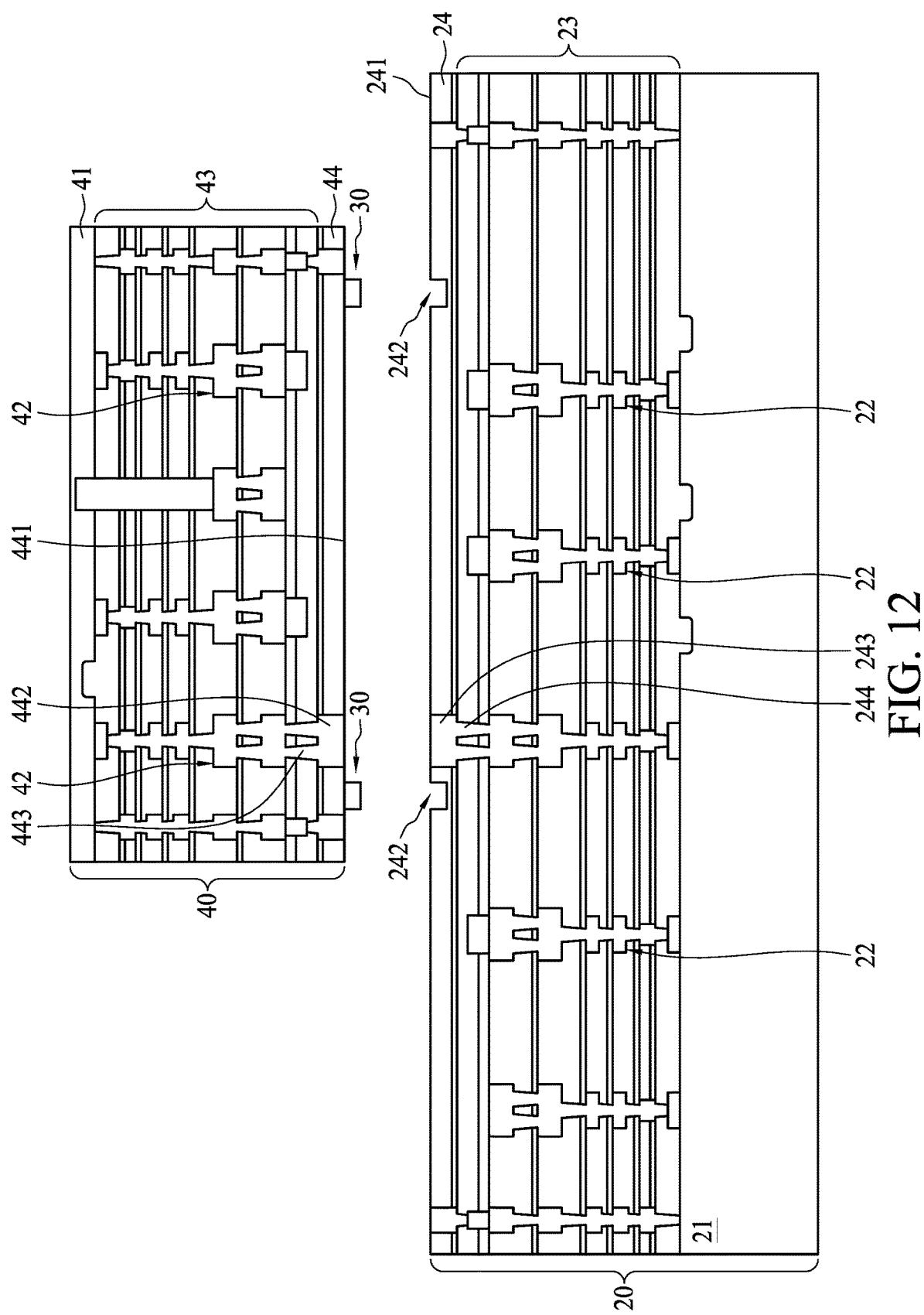

As illustrated in FIG. 12, in operation 705, a portion of the positioning layer 301 is removed to form a positioning member 30. In some embodiments, the positioning member 30 is formed on the second die 40. In some embodiments, the positioning member 30 is formed on the second bonding layer 44. In some embodiments, the metal pad 442 and the positioning member 30 are offset from a top view.

In some embodiments, a portion of the dielectric paste of the positioning layer 301 is removed until the metal pad 442 and a portion of the second bonding layer 44 are exposed, while the positioning member 30 thus formed is disposed on the second bonding layer 44. In some embodiments, after the portion of the dielectric paste is removed, a curing process or hardening process is performed to evaporate the solvent. For example, in some embodiments, the dielectric paste is cured by a soft-baking process. After the remaining dielectric paste is cured, the positioning member 30 is formed. In some embodiments, the positioning layer 301 including metallic material is etched using, for example, acceptable photolithography techniques, to form the positioning member 30.

In some embodiments, the method 70 further includes facing the second bonding layer 44 and the positioning member 30 toward the first die 20. In some embodiments, the method 70 further includes aligning the positioning member 30 to the recess 242.

Figure 13:
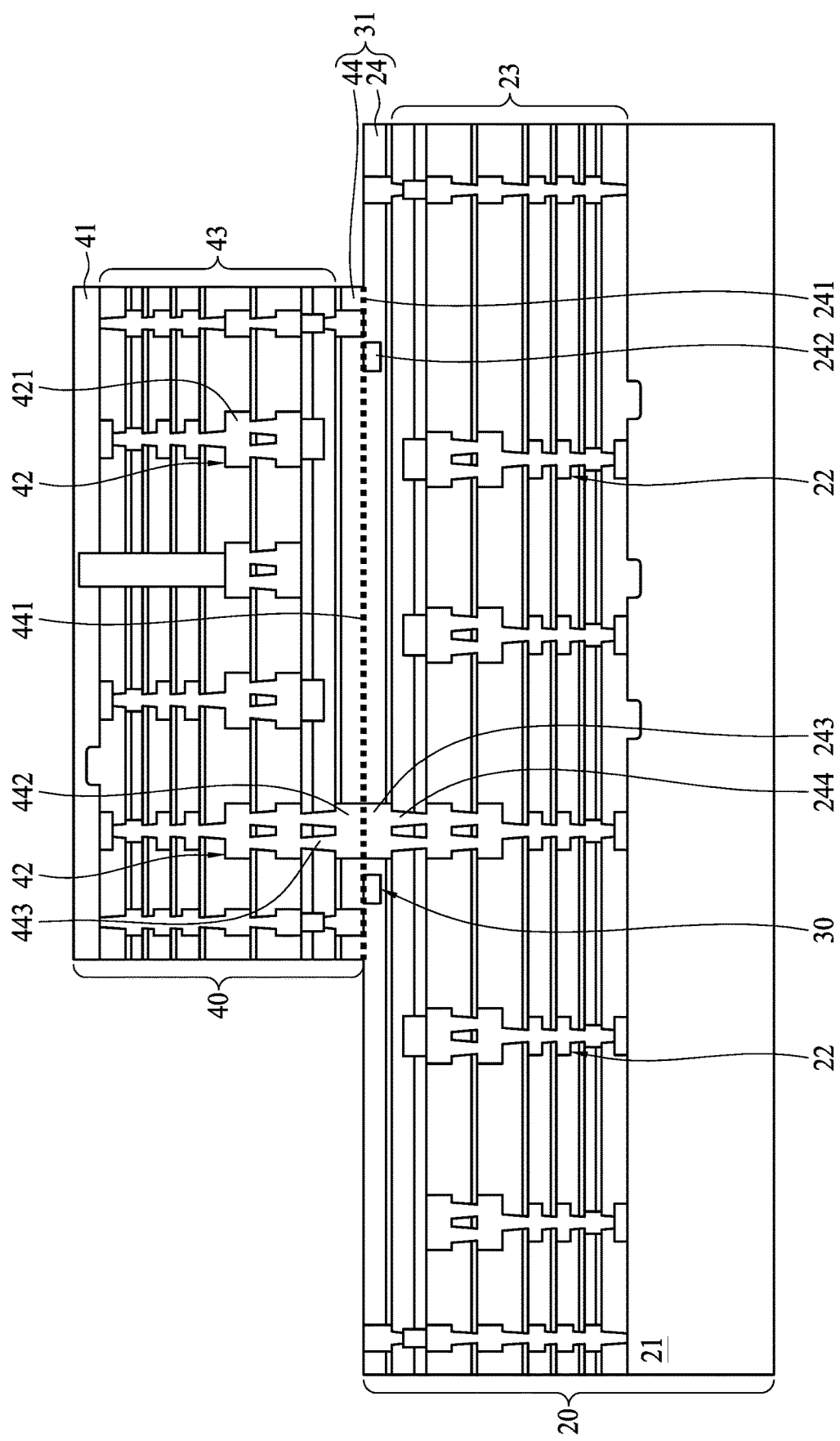

As illustrated in FIG. 13, in operation 706, the second die 40 is bonded over the first die 20 using the first bonding layer 24, and in operation 707, the positioning member 30 is disposed into the recess 242. In some embodiments, the second die 40 and the first die 20 are bonded by hybrid bonding. In some embodiments, to achieve the hybrid bonding, the second die 40 is first pre-bonded to the first bonding layer 24 and the metal pad 243 by lightly pressing the second die 40 against the first die 20. An anneal is then performed to cause the inter-diffusion of the metals in the metal pad 243 and the corresponding overlying metal pad 442.

In some embodiments, the positioning member 30 is disposed in the recess 242 during the bonding of the second die 40 over the first die 20 using the first bonding layer 24. In some embodiments, after the bonding of the second die 40 over the first die 20, a bonding dielectric 31 is formed, and the positioning member 30 is disposed within the bonding dielectric 31. In some embodiments, the bonding dielectric 31 is formed by attaching the first bonding layer 24 to the second bonding layer 44. In some embodiments, the first die 20 is electrically coupled to the second die 40. In some embodiments, the metal pad 243 is in contact with the metal pad 442. In some embodiments, the positioning member 30 is disposed in the recess 242 during the bonding of the second die 40 over the first die 20.

One aspect of this disclosure relates to a semiconductor structure. The semiconductor structure includes a first die, a second die over the first die, and a positioning member disposed within the bonding dielectric and configured to align the second die with the first die.

In some embodiments, the bonding dielectric includes a first bonding layer disposed between the first die and the second die, and a second bonding layer disposed between the first bonding layer and the second die. In some embodiments, the second bonding layer has a second surface facing the first die, and the positioning member protrudes from the second surface of the second bonding layer. In some embodiments, the first bonding layer surrounds the positioning member. In some embodiments, the first bonding layer has a first surface facing the second die, a recess in the first surface of the first bonding layer extends from the first surface into the first die, and the positioning member is disposed in the recess. In some embodiments, a gap is disposed between the positioning member and the bonding dielectric. In some embodiments, a coefficient of thermal expansion of the bonding dielectric and a coefficient of thermal expansion of the positioning member are different. In some embodiments, the positioning member includes metal, dielectric or a combination thereof, in some embodiments, the first die is electrically coupled to the second die. In some embodiments, the first die includes a first interconnect structure, the second die includes a second interconnect structure, and the positioning member is isolated from the first interconnect structure and the second interconnect structure. In some embodiments, the positioning member is tapered toward the first die.

An aspect of this disclosure relates to a semiconductor structure. The semiconductor structure includes a first die including a first bonding layer, a second die including a second bonding layer over the first die, and a positioning member protruding from the second bonding layer and received by the first bonding layer.

In some embodiments, a coefficient of thermal expansion of the positioning member is different from a coefficient of thermal expansion of the first bonding layer. In some embodiments, the first bonding layer is in contact with the second bonding layer. In some embodiments, the coefficient of thermal expansion of the positioning member is substantially equal to the coefficient of thermal expansion of the first bonding layer. In some embodiments, the semiconductor structure further includes a molding surrounding the second die. In some embodiments, a portion of the first bonding layer is exposed through the second bonding layer and is in contact with the molding.

An aspect of this disclosure relates to a method for forming a semiconductor structure. The method includes receiving a first die having a first bonding layer; forming a recess on the first bonding layer; and forming a positioning member on a second die. The method further includes bonding the second die over the first die using the first bonding layer; and disposing the positioning member into the recess.

In some embodiments, the method further includes forming a second bonding layer on the second die, and forming the positioning member on the second bonding layer. In some embodiments, the method further includes forming a positioning layer on the second die; and removing a portion of the positioning layer to form the positioning member.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first die including a first interconnect structure;
   a second die over the first die and including a second interconnect structure;
   a bonding dielectric disposed between the first die and the second die; and
   a positioning member disposed within the bonding dielectric and configured to align the second die with the first die,
   wherein the positioning member includes dielectric, is surrounded by the bonding dielectric, and is isolated from the first interconnect structure and the second interconnect structure.

2. The semiconductor structure of claim 1, wherein the bonding dielectric includes a first bonding layer disposed between the first die and the second die, and a second bonding layer disposed between the first bonding layer and the second die.

3. The semiconductor structure of claim 2, wherein the second bonding layer has a second surface facing the first die, and the positioning member protrudes from the second surface of the second bonding layer.

4. The semiconductor structure of claim 2, wherein the first bonding layer surrounds the positioning member.

5. The semiconductor structure of claim 2, wherein the first bonding layer has a first surface facing the second die, a recess in the first surface of the first bonding layer extends from the first surface into the first die, and the positioning member is disposed in the recess.

6. The semiconductor structure of claim 1, wherein a gap is disposed between the positioning member and the bonding dielectric.

7. The semiconductor structure of claim 1, wherein a coefficient of thermal expansion of the bonding dielectric and a coefficient of thermal expansion of the positioning member are different.

8. The semiconductor structure of claim 1, wherein a thickness of the bonding dielectric is greater than a thickness of the positioning member.

9. The semiconductor structure of claim 1, wherein the first die is electrically coupled to the second die.

10. The semiconductor structure of claim 1, wherein the positioning member and the first interconnect structure are laterally offset from a top view.

11. The semiconductor structure of claim 1, wherein the positioning member is tapered toward the first die.

12. A semiconductor structure, comprising:
    a first die including a first bonding layer, a first interconnect structure and a first metal pad surrounded by the first bonding layer and electrically connected to the first interconnect structure;
    a second die including a second bonding layer over the first die, a second interconnect structure and a second metal pad surrounded by the second bonding layer and electrically connected to the second interconnect structure; and
    a positioning member protruding from the second bonding layer and surrounded by the first bonding layer,
    wherein the positioning member includes dielectric, and the positioning member is isolated from the first interconnect structure and the second interconnect structure and laterally offset from the first metal pad and the second metal pad from a top view.

13. The semiconductor structure of claim 12, wherein a coefficient of thermal expansion of the positioning member is different from a coefficient of thermal expansion of the first bonding layer.

14. The semiconductor structure of claim 12, wherein the first bonding layer is in contact with the second bonding layer.

15. The semiconductor structure of claim 12, wherein a coefficient of thermal expansion of the positioning member is substantially equal to a coefficient of thermal expansion of the first bonding layer.

16. The semiconductor structure of claim 12, further comprising a molding surrounding the second die.

17. The semiconductor structure of claim 16, wherein a portion of the first bonding layer is exposed through the second bonding layer and is in contact with the molding.

18. A semiconductor structure, comprising:
    a first die including a first bonding layer, a first interconnect structure and a first metal pad, wherein the first bonding layer includes a recess, and the first metal pad is surrounded by the first bonding layer and electrically connected to the first interconnect structure;

a second die including a second bonding layer over the first die, a second interconnect structure and a second metal pad, wherein the second metal pad is surrounded by the second bonding layer and electrically connected to the second interconnect structure; and a positioning member protruding from the second bonding layer and received by the recess of the first bonding layer, wherein the positioning member includes dielectric, and the positioning member is isolated from the first interconnect structure and the second interconnect structure and laterally offset from the first metal pad and the second metal pad from a top view.

19. The semiconductor structure of claim 18, wherein the positioning member and the second bonding layer are integrally formed.

20. The semiconductor structure of claim 18, wherein a thickness of the first bonding layer is greater than the thickness of the positioning member.

* * * * *